United States Patent [19]

Shefet

[11] Patent Number: 4,894,748
[45] Date of Patent: Jan. 16, 1990

[54] CONTROL TERMINAL FOR HAZARDOUS LOCATIONS

[76] Inventor: Henry Shefet, 1425 Montfort Dr., Harrisburg, Pa. 17110

[21] Appl. No.: 286,533

[22] Filed: Dec. 19, 1988

[51] Int. Cl.$^4$ .............................................. H05K 7/00
[52] U.S. Cl. ................................................. 361/380
[58] Field of Search .................... 174/15.1, 50, 52.3, 174/17 R, 17 GF; 361/331, 356, 380, 381, 384, 390, 395

[56] References Cited

U.S. PATENT DOCUMENTS

| | | |
|---|---|---|
| 1,453,083 | 4/1923 | Schuler . |
| 2,250,977 | 7/1941 | Walker ................. 361/356 |
| 2,307,612 | 1/1943 | Westendorp ............ 250/87 |
| 2,943,134 | 6/1960 | Liao et al. ............... 174/16 |
| 3,275,893 | 9/1966 | Phillips et al. .......... 317/100 |
| 3,281,521 | 10/1966 | Wilson .................. 174/17 |
| 4,685,018 | 8/1987 | Tada et al. .............. 361/1 |

FOREIGN PATENT DOCUMENTS

| | | |
|---|---|---|
| 1228702 | 3/1967 | Fed. Rep. of Germany . |
| 2108465 | 10/1971 | Fed. Rep. of Germany ...... 361/331 |
| 3221900 | 10/1983 | Fed. Rep. of Germany ...... 361/331 |
| 928455 | 1/1961 | United Kingdom ............. 361/331 |

Primary Examiner—Gregory D. Thompson
Attorney, Agent, or Firm—Robert F. Palermo

[57] ABSTRACT

A control terminal for use in hazardous environments, or in environments which are deleterious to electronic devices is disclosed. The terminal is housed in an enclosure which is purged with clean dry air or inert gas and is maintained at a slight positive internal pressure to prevent entry of the outside atmosphere. All electrical connections and purge controls which are active prior to completion of the purge are housed in internal and external explosion proof boxes, except for the explosion-proof flow switch which controls the purging air flow. After purge, the slightly positive internal enclosure pressure is controlled by a gas demand switch which operates a valve to admit air whenever internal pressure drops below the gas demand switch set-point. A low pressure cut out switch opens and interrupts terminal power whenever internal pressure drops to the low pressure cut out switch set point which is barely above one atmosphere, absolute. Overtemperature protection is provided by temperature sensors which activate purge air flow to purge warm air from the enclosure or to interrupt terminal power when the purge air cooling rate is less than the terminal operation heating rate.

10 Claims, 1 Drawing Sheet

U.S. Patent  Jan. 16, 1990  4,894,748
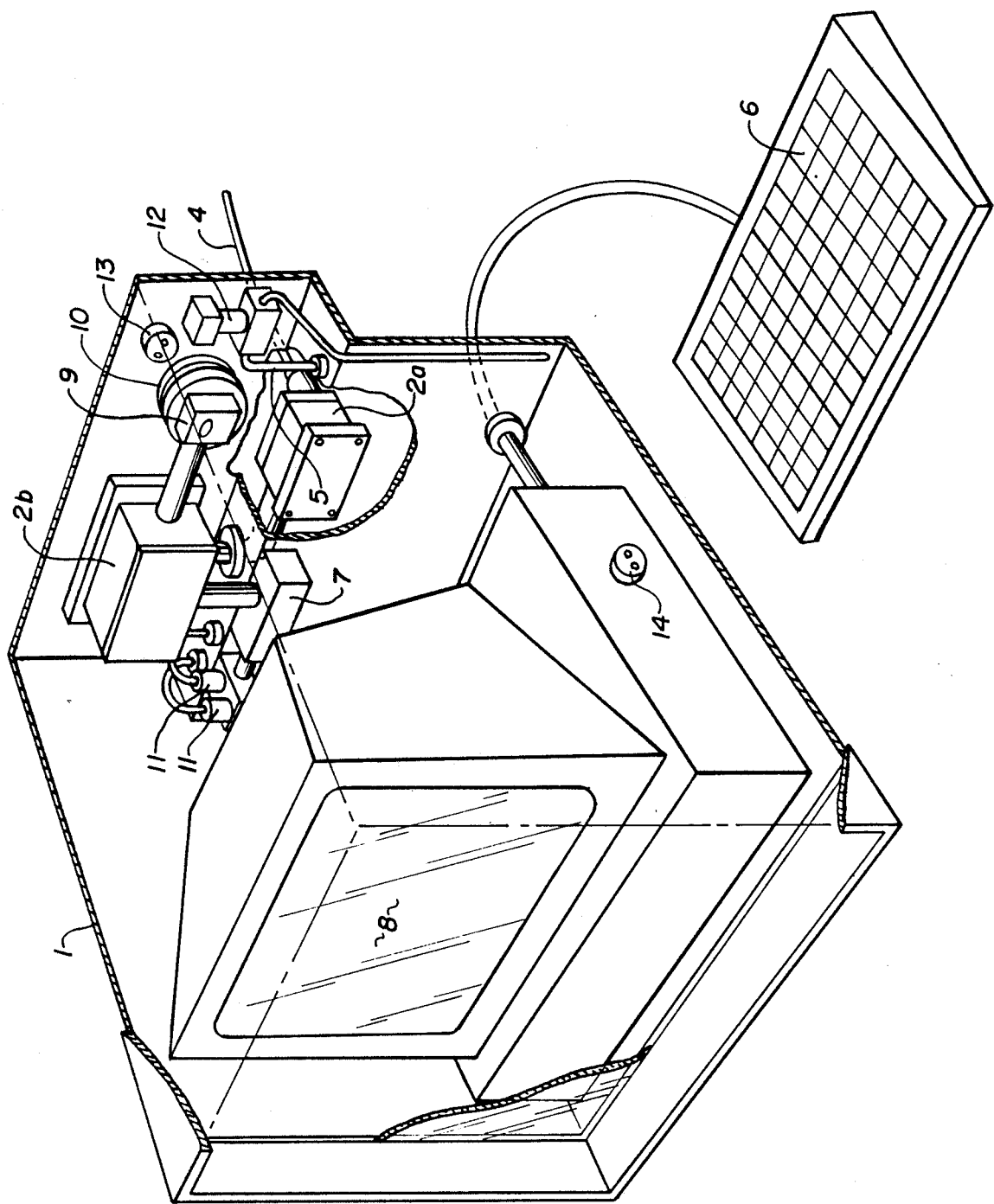

CONTROL TERMINAL FOR HAZARDOUS LOCATIONS

BACKGROUND OF THE INVENTION

This invention relates to improvements in control terminals which permit their safe use in hazardous locations. In particular, these improvements permit operation of electronic data terminals in environments containing explosive concentrations of inflammable gases, dusts, or vapors.

Computer control of manufacturing processes can provide increased precision by enabling real-time process adjustment by employing electronic analysis of sampling data and control feedback signals. This requires placement of input/output data terminals and monitors at critical points in the process stream where sampling data are collected and process adjustments made.

Many manufacturing processes, however, involve inflammable volatile solvents or gases, vapors, or dusts which present a danger of fire or explosion. In such environments, electronic data terminals must provide absolute certainty that they cannot cause a fire or explosion by arcing in the presence of the hazardous atmosphere. This assurance is critical in petrochemical plants, munitions plants, welding gas plants, and paint factories as well as in grain elevators and other operations which produce inflammable dust.

One common approach to avoidance of the explosion hazard in such facilities has been to locate all controls remote from the hazardous environment. This configuration requires communication between the remote data terminals and the process adjustment points which adds oportunities for delay and error.

In order to provide this safety while retaining the localized control it is desirable to provide atmospherically isolated regions for connection of primary power sources, electronics for control of purge timing and for purge maintenance, and electronics for terminal operation.

An object of this invention, therefore, is to provide a control terminal which is safe for use in explosive or inflammable environments by preventing the explosive atmosphere from contacting any potential arc source.

Besides the explosion hazard, many facilities have environments which can damage or destroy electronic equipment due to the effects of ambient atmosphere.

A further object of this invention is to provide a control terminal which is shielded from the deleterious effects of dirt, corrosive vapors, humidity, excessive ambient temperatures, and combinations of these hazards.

The terminals of the present invention provide the necessary safety and atmospheric shielding and, since they can be placed in the hazardous environment at the process control points, eliminate the delay and error potential associated with remote location. Using these terminals, the operator at each location can monitor the process and immediately make adjustments as required.

The objects of the invention and the means for accomplishing said objects will be readily understood by reference to the drawing and the descriptions thereof which will enable one skilled in the art to make and use the invention.

BRIEF DESCRIPTION OF THE DRAWING

The FIGURE shows the layout of the main system components in a cutaway view of the enclosure which illustrates locations of key components.

Referring to the FIGURE, the invention features consist of the gas purged enclosure 1, an external explosion-proof junction box 2a, a PAC seal junction 3, between the junction box 2a, and the local electrical conduit 4, a purge gas inlet line 5, and a pendant intrinsically safe keyboard 6.

Examination of the enclosure 1 as illustrated in the FIGURE shows both the external and internal explosion-proof junction boxes 2a and 2b, respectively, the explosion-proof purge gas flow switch 7, the CRT and data processing system 8, the mechanically operated low pressure cut-out switch 9, the mechanically operated gas demand switch 10, the enclosure pressure check valves 11, the solenoid air valve 12, the first overtemperature purge control switch 13, and the second overtemperature terminal power cut-off switch 14.

To accomplish the object of the invention of providing a control terminal which is safe to operate in a hazardous environment, the terminal incorporates electrical protection circuits to ensure safe startup, operation, and power-down. All components, except the explosion-proof purge gas flow switch 7, which are electrically active prior to purge are contained within the two explosion-proof boxes 2a and 2b of the FIGURE. The external explosion-proof junction box 2a, is used for connections to the local electrical power installation, which is in a safe area of the facility, by means of electrical lines in conduit 4. The connection is made through a PAC seal 3 which provides a gas tight seal to prevent flow of the hazardous atmosphere, which may be in the conduit, into the explosion-proof box 2a. The primary electrical power terminations are made within the external explosion-proof box 2a which is connected to the internal explosion-proof box 2b through an explosion-proof union. Within the internal explosion-proof box 2b are the control electronics, control relays, the purge timer, purge indicator LEDs, and the electrical termination points for the various valves and switches needed for start-up, normal operation, and power-down. Note that purge status indication is carried to the front panel of the enclosure by fiber optics bundles.

DETAILED DESCRIPTION OF THE INVENTION

Referring again to the FIGURE, operation of the control terminal, which is the subject of this inention, is described thus.

Upon application of AC power and a source of clean dry air or inert gas, the terminal enclosure 1 pressurizes to 3 to 6 psi, preferably 5 psi gauge, through the normally open solenoid gas or air valve 12. As the enclosure pressure rises, the mechanically operated low-pressure cut-out switch 9, closes at a pressure of between 0.1 and 0.5 inches, preferably 0.4 inches of water column, gauge, then the gas demand switch 10, also mechanically operated, closes at a pressure of 3 to 5 inches, preferably 4 inches of water column. Note that, although the low pressure cut-out switch 9 and gas demand switch 10 are closed mechanically due to the response of their diaphragms to enclosure pressure, they are not electrically activated until the purge timer in the internal explosion proof box 2b has timed out and the relays within the explosion proof box 2b have closed. At 5 psi, enclosure pressure purge check valves 11 open and exhaust air from the enclosure 1. These valves are equipped with flame and spark suppressors in case ignition should occur within the chamber during purge. The explosion-proof flow switch 7, monitoring the flow of air through the enclosure, closes when there is sufficient flow to exchange four times the volume of air in the enclosure in a time period between 15 minutes and 35 minutes, preferably 33 minutes, to meet NFPA type X purging specifications. Closure of the flow switch 7 starts the 33 minute purge cycle timer located in the explosion-proof box 2b.

At the end of the 33 minute purge cycle, the timer causes power to be applied to the terminal 8, all signal lines to be connected to the terminal through the signal relays, in the explosion-proof box 2b, and enclosure pressure control to be handed-off through control relays in the explosion-proof box 2b to the normal operation circuits. Because the enclosure pressure is well above the closure point of the gas demand switch 10, it remains closed and the solenoid air valve 12 is immediately energized, or closed, cutting off the air supply.

The unit is now in normal operation and will continue operational until power is removed or the air supply is interrupted resulting in a drop in pressure which cuts off power through the low pressure cut-out switch 9 at a pressure of 0.4 inches of water column, gauge. At the conclusion of the purge, the enclosure is pressurized to 5 psi gauge. Slowly, the air leaks out of the enclosure. When the pressure falls below 4 inches of water column, the gas demand switch opens causing the solenoid air valve 12 to open and allow air flow into the enclosure. Once the enclosure pressure is back above 4 inches of water column, the gas demand switch 10 again closes, energizing the solenoid air valve 12 and again closing the air supply. The gas demand cycle repeats continuously, maintaining the enclosure pressure, until power is removed, or the air supply is interrupted.

Shut down of the terminal occurs whenever the enclosure pressure drops below 0.4 inches of water column. This may be caused by interruption of air supply or by enclosure leaks of sufficient size to keep enclosure pressure below 0.4 inches. When the air supply is interrupted, eventually pressure falls below 4 inches, causing gas demand switch 10 to open and, in turn, the solenoid the air valve 12 to open. Since the air supply has been interrupted, no air flows into the enclosure. The enclosure pressure continues to drop until finally, the low-pressure cut-out switch 9 opens at 0.4 inches of water column which immediately removes terminal power and, all signals and transfers enclosure pressure control back to the start-up purge circuits wholly contained within the explosion-proof box 2b.

Two stages of over-temperature protection are provided. When enclosure temperature reaches 54 degrees Celsius (130° F.), an overtemperature purge control switch 13 causes the solenoid air valve 12 to open, allowing the enclosure 1 to pressurize, the check valves 11 to open, and the enclosure to be purged to warm air. This flow of air continues until enclosure temperature falls to 43 degrees Celsius (110° F.), where first control switch 13 cease purging and normal operation resumes. If the flow of air is insufficient to cool the terminal and temperature continues to rise, a second overtemperature terminal power cut-off switch 14 opens at 60 degrees Celsius (140° F.) cutting terminal power, and thus removing the major source of heat in the enclosure and protecting the terminal electronics from over-temperature operation. Terminal power is restored when the enclosure temperature falls below 49 degrees Celsius (120° F.) closing the second cut-off switch 14.

While I have shown and described a particular embodiment of my invention, various modifications in construction, components, operating parameters, and application can be made without departing from my invention in its broad functional aspects. For instance, it is clear that a control terminal and/or a computer, as described herein, can be used in any environment, not only in environments presenting a fire or explosion hazard. Consequently, this invention could be employed to protect sensitive electronic control terminals and computers from non-explosive environments which may cause deterioration of the terminals due to humidity, corrosion, or contamination. Other such variations will be obvious to those skilled in the art. The appended claims, thus, address these anticipated modifications as lie within the scope of our invention.

I claim:

1. In an electronic control terminal system for use in hazardous atmospheres or atmospheres which are deleterious to electronic equipment, the combination comprising an enclosure pressurized with air or inert gas, through a normally open solenoid valve, purge check valves equipped with flame and spark suppressors, a mechanically operated low pressure cut-out switch which operates at a positive gauge pressure, a mechanically operated gas demand switch which operates at a gauge pressure between 3 and 5 inches of water column, an explosion-proof flow switch which assures a sufficient flow rate to purge the enclosure in the desired time, a purge timer, an internal atmospherically isolated explosion-proof junction box containing all components which are electrically active prior to purge completion except for the explosion-proof flow switch, an external atmospherically isolated explosion-proof junction box containing all external power terminals, a PAC seal connection between the external explosion-proof junction box and local electrical power conduit, an explosion-proof union for interconnection between the external and internal explosion-proof junction boxes, a cathode-ray tube monitor and data processing unit, a first overtemperature purge control switch, a second overtemperature terminal power cut-off switch and a pendant intrinsically safe keyboard.

2. A terminal system, as in claim 1, wherein the low pressure cut-out switch is set to operate at a pressure of 0.4 inches of water column.

3. A terminal system, as in claim 2, wherein the gas demand switch is set to operate at a pressure of 4.0 inches of water column.

4. A terminal system, as in claim 1, wherein the explosion-proof flow switch is set to close and activate the purge timer when the gas flow rate is sufficient to exchange four times the enclosure air volume in 33 minutes.

5. A terminal system, as in claim 1, wherein the purge timer is set to provide a full purge in 33 minutes.

6. A terminal system, as in claim 1, wherein the purge check valves are designed to maintain an enclosure pressure of 5 psig, maximum.

7. A terminal system, as in claim 1, wherein the first over-temperature purge control switch is set to initiate purge at 54 degrees Celsius (130° F.).

8. A terminal system, as in claim 1, wherein the first overtemperature purge control switch is set to cease purging at 43 degrees Celsius (110° F.).

9. A terminal system, as in claim 1, wherein the second overtemperature terminal power cut-off switch is set to open an interrupt terminal power at 60 degrees Celsius (140° F.).

10. A terminal system as in claim 1, wherein the second overtemperature terminal power cut-off switch is set to close and restore terminal power at 49 degrees Celsius (120° F.).

* * * * *